US006417094B1

(12) United States Patent
Zhao et al.

(10) Patent No.: US 6,417,094 B1
(45) Date of Patent: Jul. 9, 2002

(54) DUAL-DAMASCENE INTERCONNECT STRUCTURES AND METHODS OF FABRICATING SAME

(75) Inventors: Bin Zhao; Liming Tsau, both of Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/224,339

(22) Filed: Dec. 31, 1998

(51) Int. Cl.[7] .......................................... H01L 21/4763
(52) U.S. Cl. ....................... 438/627; 438/639; 438/640; 438/633
(58) Field of Search ................................ 438/633, 639, 438/640, 978, FOR 458, 627; 257/762, FOR 355

(56) References Cited

U.S. PATENT DOCUMENTS

| 5,595,937 A | | 1/1997 | Mikagi |
| 5,612,254 A | | 3/1997 | Mu et al. |
| 5,705,430 A | | 1/1998 | Avanzino et al. |
| 5,753,967 A | | 5/1998 | Lin |
| 5,821,168 A | * | 10/1998 | Jain |
| 5,843,842 A | * | 12/1998 | Lee et al. |
| 5,985,762 A | * | 11/1999 | Geffken et al. |
| 6,023,102 A | * | 2/2000 | Nguyen et al. |
| 6,165,880 A | * | 12/2000 | Yaung et al. |
| 6,174,806 B1 | * | 1/2001 | Thakur et al. |

FOREIGN PATENT DOCUMENTS

| JP | 63190357 A | * | 8/1988 |
| JP | 3151638 A | * | 6/1991 |
| JP | 4162719 A | * | 6/1992 |

OTHER PUBLICATIONS

J. Givens et al, Selective Dry Etching in a High Density Plasma for 0.5 um Complementary Metal–Oxide–Semiconductor Technology, 1994 American Vacuum Society, J. Vac. Sci. Technol. B 12(1), Jan./Feb. 1994, p. 427–430.

B. Zhao et al, Aluminum Dual Damascene Interconnects With Low–k Intra/Inter–Level Dielectric for Reduced Capacitance and Low Cost.

Peter Singer, Making the Move to Dual Damascene Processing, Aug. 1997, Semiconductor International/97.

* cited by examiner

Primary Examiner—George Fourson
Assistant Examiner—Michelle Estrada
(74) Attorney, Agent, or Firm—Farjami & Farjami LLP

(57) ABSTRACT

An interconnect fabrication process and structure provides barrier enhancement at the via sidewalls and improved capability to fabricate high aspect ratio dual damascene interconnects. A via structure is patterned into the via dielectric first, then a dielectric barrier (for example, anisotropically etched silicon nitride) is formed only along the via sidewalls in the dual damascene structure prior to deposition of a metal barrier (for example, Ta/TaN). In this way, the effective barrier thickness along the bottom of the via is increased, eliminating the structure's susceptibility to metal migration. The absence of dielectric barrier along the interconnect trench sidewalls leads to low interconnect resistance and low interconnect capacitance. The present invention also provides an improved fabrication method for obtaining high aspect ratio dual damascene interconnect structures.

15 Claims, 13 Drawing Sheets

SINGLE DAMASCENE

DUAL DAMASCENE

DUAL-DAMASCENE INTERCONNECT STRUCTURES AND METHODS OF FABRICATING SAME

TECHNICAL FIELD

The present invention relates, generally, to methods and structures for improving the reliability and manufacturability of multilevel interconnects in integrated circuits and, more particularly, to a dual damascene process with barrier enhancement at the via sidewalls and improved capability for fabricating high aspect ratio interconnect structures.

BACKGROUND ART AND TECHNICAL PROBLEMS

Through advanced semiconductor processing techniques, integrated circuit devices with sub-micron and sub-half-micron features sizes can now be manufactured. This trend toward deep submicron technology (i.e., involving feature sizes less than 0.35 microns) has, in turn, driven the need for multilayer interconnects. As a result, circuit performance in the deep submicron regime is increasingly a function of the delay time of electronic signals traveling between the millions of gates and transistors present on the typical integrated circuit chip. Parasitic capacitance and resistance effects resulting from these otherwise passive interconnect structures must therefore be well-controlled. Toward this end, recent trends emphasize the use of low resistance metals (e.g., copper) in conjunction with insulating materials with low dielectric constants ("low-k dielectrics") between metal lines. A low-k dielectric is a dielectric material which exhibits a dielectric constant substantially less than conventional dielectric materials such as silicon dioxide, silicon nitride, and silicon oxynitride. Silicon dioxide, for example, has a dielectric constant of about 4.0. Copper is desirable in that its conductivity is relatively high and it is less susceptible to electromigration failure than many metals (for example, aluminum).

Modern semiconductor processing techniques increasingly employ Chemical-Mechanical Polishing (CMP) in the fabrication of interconnect layers, particularly where the number of layers rises above three and the conductive lines themselves are characterized by a high aspect ratio (e.g., lines on the order of 0.25 $\mu$m in width and on the order of 1.0 $\mu$m in height). In a paradigmatic CMP process, a resinous polishing pad (e.g., a polyurethane pad) is employed in conjunction with a mechanically and chemically active slurry. When pressure is applied between the polishing pad and the wafer being polished, mechanical stresses are concentrated on the exposed edges of the adjoining cells in the cellular pad. Abrasive particles within the slurry concentrated on these edges tend to create zones of localized stress at the workpiece in the vicinity of the exposed edges of the polishing pad. This localized pressure creates mechanical strain on the chemical bonds comprising the surface being polished, rendering the chemical bonds more susceptible to chemical attack by the slurry. Thus, with the correct choice of slurry, pressure, and other process conditions, a highly planar surface may be formed on the wafer.

A fabrication method which employs CMP techniques and which addresses many of the above concerns is the so-called "damascene" process. Damascening acquired its name from an ornamental technique, generally attributed to metal-workers in ancient Damascus, which involved scribing or incising patterns into steel (most often swords) then filling the resulting grooves with gold or silver prior to final polish. Similarly, the modern semiconductor analog of this process involves, in the broadest sense, forming patterns in a dielectric layer, filling the resulting pattern with interconnect metal, then polishing away the excess metal on the wafer surface and leaving inlaid interconnect metal features.

There are two major classes of damascene processes: single-damascene and dual-damascene. These two processes are illustrated in highly simplified form in FIGS. 1A and 1B (details of the various intermediary steps are discussed in further detail below). Briefly, and with reference to FIG. 1A, a single damascene process involves making contact to a lower level conductor 102 (formed, for example, on substrate 107) by patterning dielectric layer 106 and forming a conductive plug 104 in dielectric layer 106, then patterning a second dielectric layer 110 and forming the actual interconnect wiring metallization 108 in patterned dielectric layer 110. In a dual-damascene process (FIG. 1B), the interconnect wiring 108 and plug 104 are formed by patterning both the via and the trench patterns into dielectric 106, then filling them simultaneously with metal. The dual damascene process offers the advantages of process simplification and lower manufacturing cost.

The use of Cu as interconnect metal in dual damascene IC devices gives rise to many difficulties and challenges. For example, copper tends to migrate or diffuse into the silicon dioxide, where it acts to increase leakage currents or actually short-out adjacent conductors. In addition, once Cu diffuses through the silicon dioxide and reaches the silicon devices, the device will generally malfunction in some manner. This has motivated the semiconductor industry to form diffusion barriers around any copper conductors present in the structure. The inner surfaces (i.e., the bottom and sides of the via and trench) are typically coated with a thin layer of Ti, TiN, Ta, TaN, WN or another adequate barrier metal.

TiN, which is popular as a barrier layer in Al/W interconnect structures, is generally unsatisfactory for use with advanced copper interconnect structures. First, it has been found that TiN exhibits inferior resistance to copper migration. Second, TiN is not compatible with current Cu plating techniques used in Cu deposition due to, among other things, problems with adhesion of the Cu to TiN. Specifically, Cu is plated directly on TiN along the wafer edge with poor adhesion.

As a result, the use of Ta and/or TaN as a barrier metal has become quite popular. Ta and TaN may be deposited by physical vapor deposition (PVD) or chemical vapor deposition (CVD). Unfortunately, however, CVD TaN/Ta suffers from low deposition rate and high deposition temperature (i.e., temperatures greater than 500° C.). These high temperatures and low deposition rates are incompatible with current interconnect processes as well as future processes incorporating low-k dielectrics. Even in the case where an ionized PVD process is used, high aspect ratio interconnects are prone to poor step coverage of the barrier layer at the sidewall of the vias. More particularly, referring now to FIG. 2A, a via structure 104 formed within a dielectric 106 (linking metal pattern 108 and lower level conductor 102), is lined with a barrier 224. As mentioned above, barrier 224 typically comprises Ta or TaN. Using known methods, for example, ionized PVD, the thickness of barrier layer 224 is significantly less near the lower portion of the via sidewall (226). As a result, these regions are particularly susceptible to Cu migration (228).

Furthermore, referring now to FIG. 2B, in the case where conductor 102 comprises copper, a layer of copper 230 may be deposited along the sidewalls near the bottom of the via prior to formation of metal barrier 224. That is, copper (from copper conductor 102) tends to be sputtered along the sidewalls (1) during the silicon nitride etch used to open the via connection to conductor 102; and (2) during the sputter-clean of conductor 102 just prior to deposition of metal barrier 224. As mentioned above, this copper may then diffuse into surrounding structures, leading to significant reliability problems.

In addition, etching of high aspect ratio (AR) dual-damascene features is itself very challenging. Although etching dielectrics is generally easier than etching metals (thus the desirability of damascene processes), as the lateral feature size of interconnects continue to shrink, etching the dual damascene structures of very high AR features leads to fabrication difficulties.

Methods and structures are therefore needed in order to overcome these and other limitations in the prior art. More particularly, there is a long felt need for reliable and manufacturable interconnect structures.

SUMMARY OF THE INVENTION

An interconnect fabrication process and structure in accordance with the present invention overcomes limitations of the prior art by providing barrier enhancement at the via sidewalls and easing the fabrication of high aspect ratio dual-damascene interconnect structures. In accordance with the present invention, a via structure is patterned into the via dielectric first. A dielectric barrier (for example, anisotropically etched silicon nitride) is formed only along the via sidewalls in the dual damascene structure prior to deposition of a metal barrier (for example, Ta/TaN). In this way, the effective barrier thickness along the bottom of the via sidewalls is increased, eliminating the structure's susceptibility to metal migration. The absence of dielectric barrier along the interconnect trench sidewalls leads to low interconnect resistance and low interconnect capacitance. The present invention also provides an improved fabrication method for obtaining high aspect ratio dual damascene interconnect structures.

BRIEF DESCRIPTION OF THE DRAWING FIGURES

The subject invention will hereinafter be described in conjunction with the appended drawing figures, wherein like numerals denote like elements, and:

DETAILED DESCRIPTION OF PREFERRED EXEMPLARY EMBODIMENTS

Figure 1A:
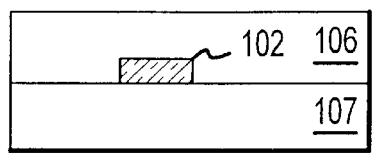
FIG. 1A is a diagrammatic illustration of a conventional single damascene interconnect process.
Figure 1A:
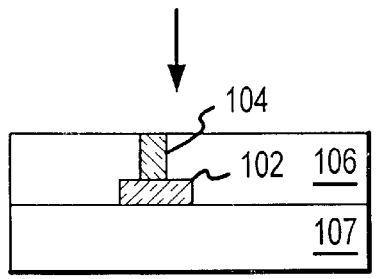
Figure 1A:
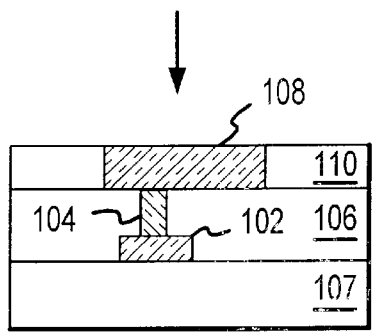
Figure 1B:
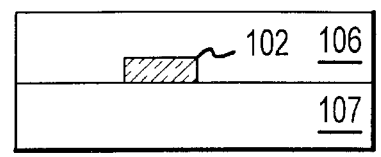
FIG. 1B is a diagrammatic illustration of a conventional dual-damascene interconnect process.
Figure 1B:
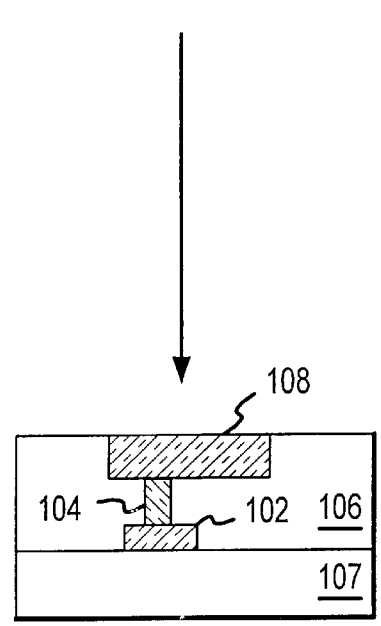

An interconnect fabrication process in accordance with various aspects of the present invention provides barrier enhancement at the via sidewall and improved capability to fabricate high aspect ratio dual damascene structures. While the manner in which the present invention addresses limitations of the prior art are discussed in detail below, in general, referring momentarily to FIG. 4, a via structure 400 formed within a dielectric 309 (linking metal pattern 326 and conductor 304), is lined with a barrier dielectric layer 314 (for example, silicon nitride) prior to deposition of metal barrier 328 onto the dual damascene structure. As a result, the effective barrier thickness along the bottom of the via (410) as well as the top of the via (412) is sufficient to eliminate the structure's susceptibility to Cu migration.

Figure 5:
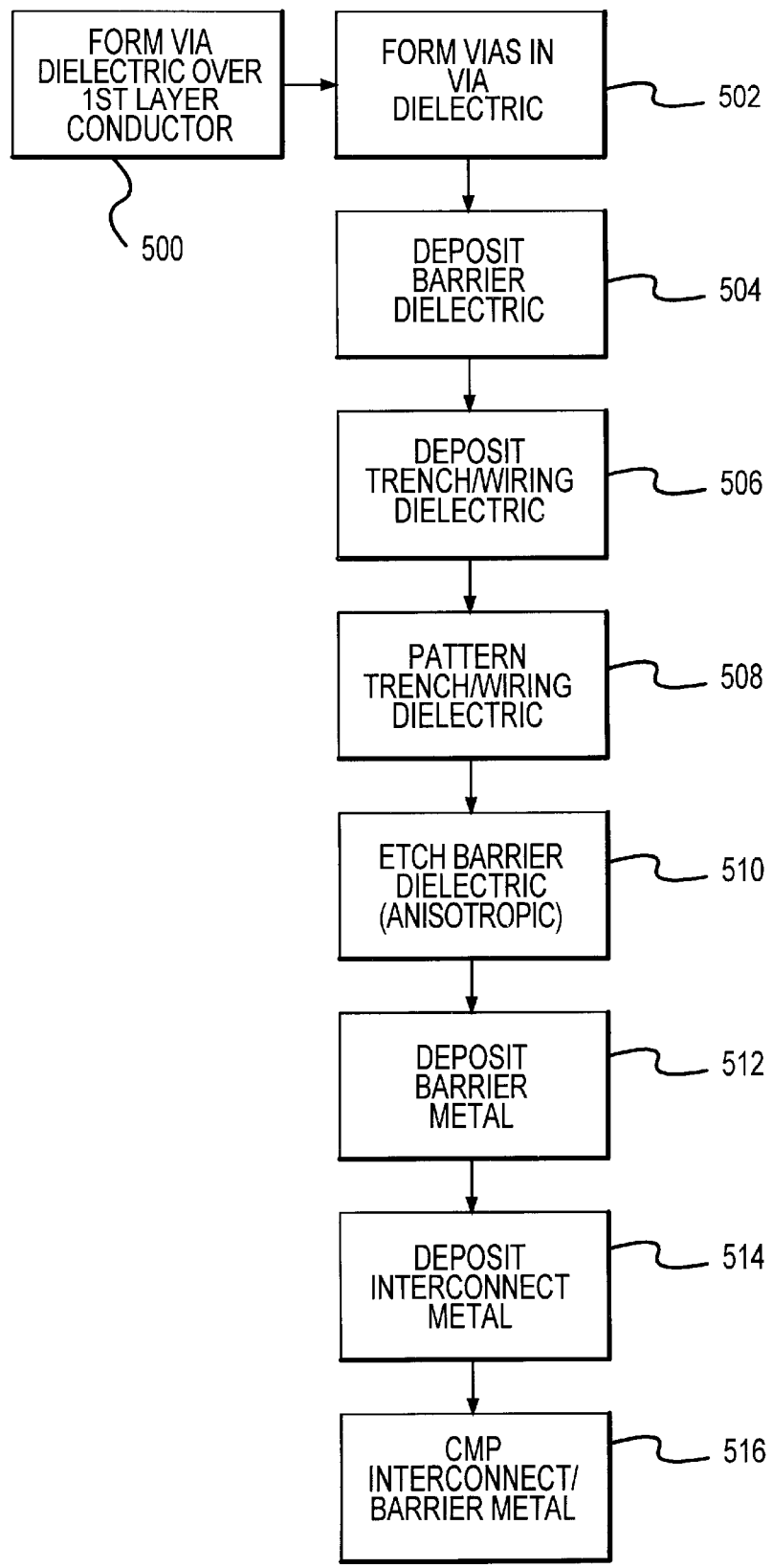
FIG. 5 is a flowchart depicting an exemplary processing method in accordance with the present invention.
Figure 6A:
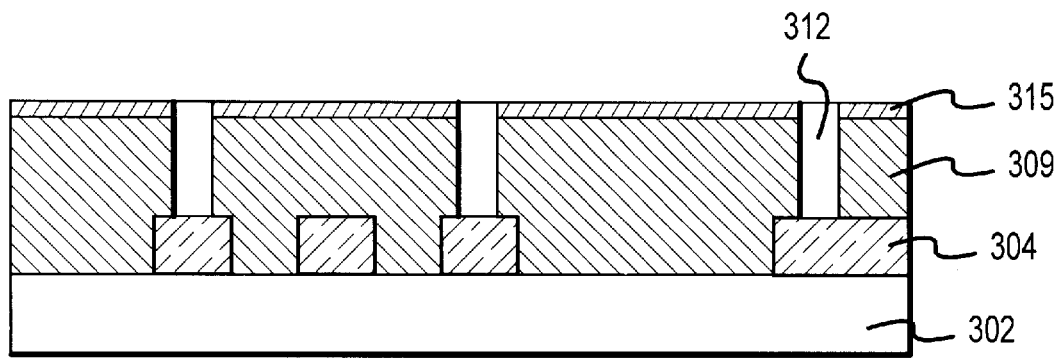
FIGS. 6A–6F shows cross-sectional illustrations of an alternative method of forming dual-damascene interconnects by first forming vias into the via dielectric in accordance with the present invention.
Figure 6B:
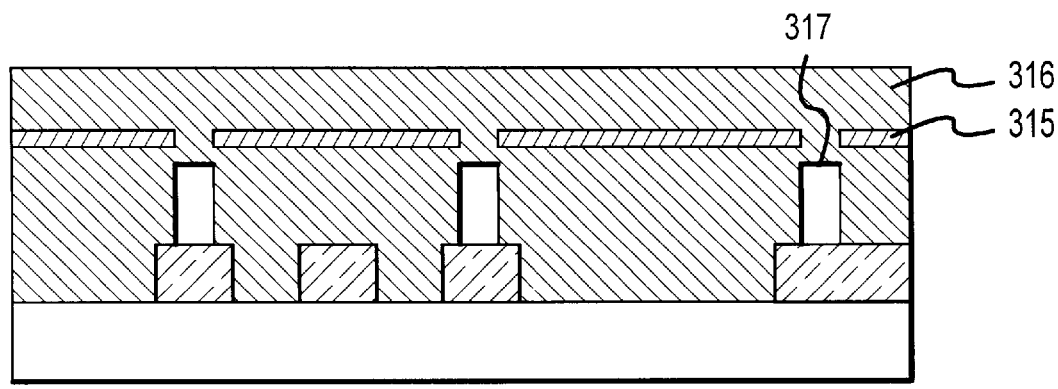
Figure 6C:
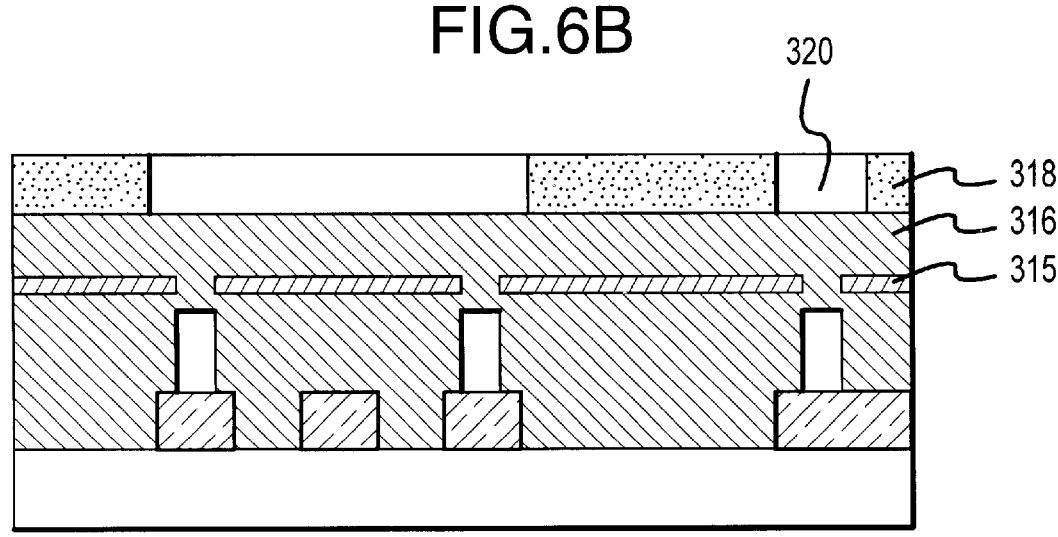
Figure 6D:
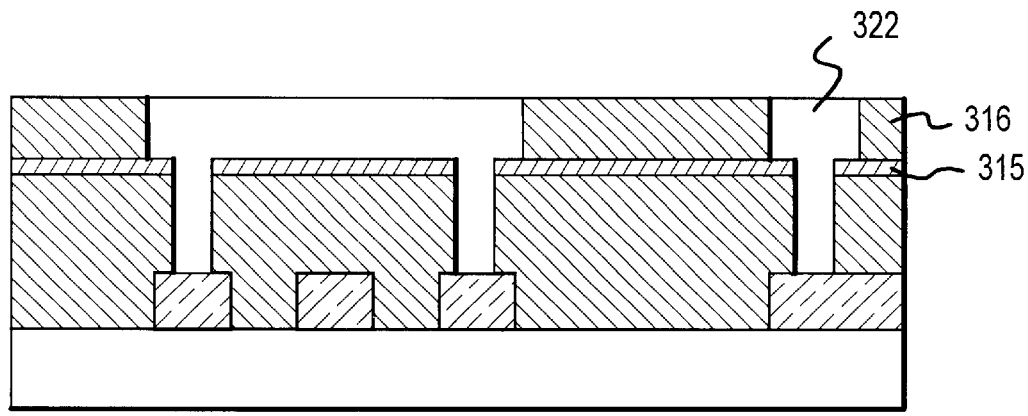
Figure 6E:
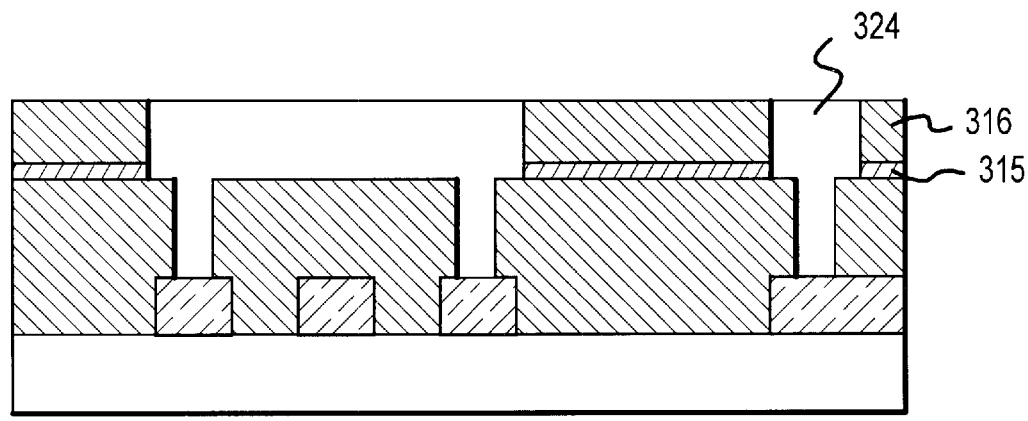
Figure 6F:
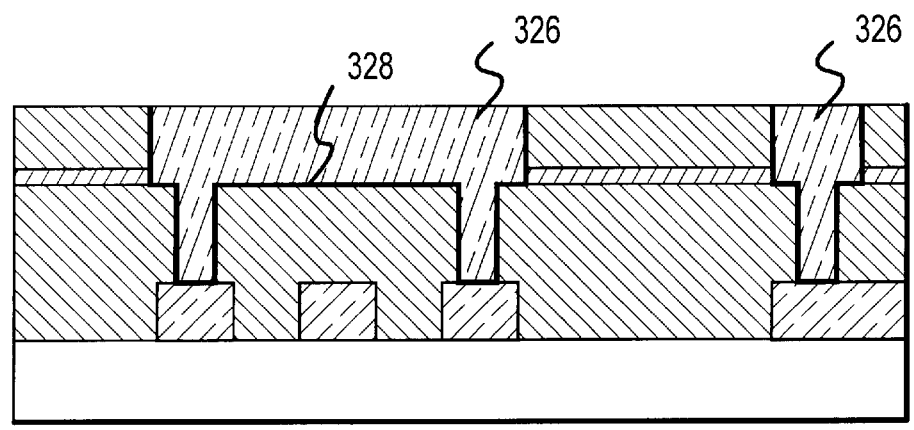

Referring now to the flowchart shown in FIG. 5, an exemplary method of practicing the present invention will now be described in conjunction with the cross-sectional diagrams shown in FIG. 3. It should be understood that the exemplary process illustrated may include more or less steps or may be performed in the context of a larger processing scheme. Furthermore, the various flowcharts presented in the drawing figures are not to be construed as limiting the order in which the individual process steps may be performed.

Initially, at Step 500, the first level conductor, contact diffusion area, or the like is obtained. For example, in the illustrated embodiment, a first metal wiring pattern 304 and a substantially planar via dielectric 309 (often referred to as "via dielectric" as via plugs are formed within this dielectric layer) are formed on substrate 302 (see FIG. 3A). This step may be performed through a variety of conventional techniques (e.g., CMP of deposited dielectric or a damascene process). Conductor 304 suitably consists of a layer or layers of various conductive materials, including, for example, titanium, titanium nitride, tantalum, tantalum nitride, tungsten nitride, aluminum, aluminum-copper alloys, gold, copper, silver, tungsten, or any other suitable conductive material. In addition, conductor 304 may consist of a previous diffused contact region in a semiconductor, a silicon contact, a previous interconnect structure, or any other layer or region to which an interconnect may be formed.

Dielectric 309 suitably comprises silicon dioxide, silicon oxynitride, silicon nitride, or any of the various low-k dielectric materials. In a preferred embodiment, via dielectric layer 309 comprises a plasma-enhanced CVD (PECVD) layer of silicon dioxide approximately 0.4 $\mu$m–1.0 $\mu$m thick above conductor 304, although other materials and thicknesses may be used. Optionally, a thin dielectric cap layer (not shown in FIG. 3A) is deposited on top of layer 309. This thin cap layer (e.g., silicon dioxide or silicon nitride) desirably acts as a hard mask for via etch when layer 309 is a low-k dielectric.

Substrate 302 includes any suitable substrate material upon which or within which semiconductor devices may be formed. Suitable materials for substrate 302 include, for example, group IV semiconductors (i.e., Si, Ge, and SiGe), group III–V semiconductors (i.e., GaAs, InAs, and AlGaAs), and other less-conventional materials, such as SiC, diamond, and sapphire. Substrate 302 may comprise single crystal material, or may comprise one or more polycrystalline or amorphous epitaxial layer formed on a suitable base material. It will be appreciated that substrate 302 may also comprise various devices incorporated into a semiconductor material as well as interconnect structures consisting of conductive paths and various dielectrics for isolating these conductive paths.

Figure 3A:
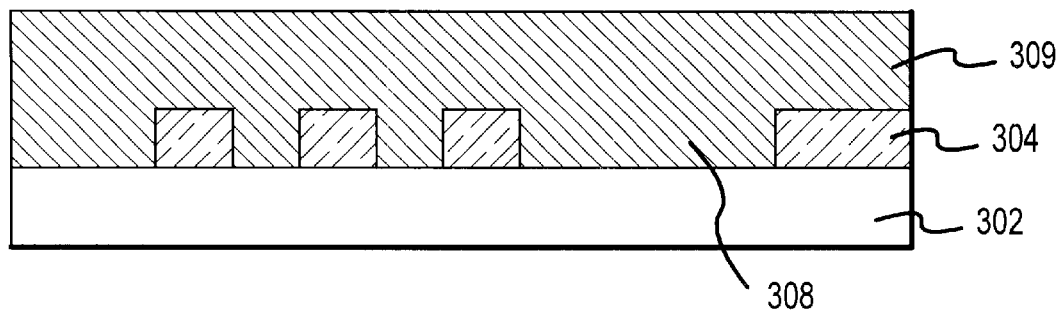
FIGS. 3A–3H shows cross-sectional illustrations of a method of forming dual-damascene structures by first patterning vias in the via dielectric in accordance with various aspects of the present invention.
Figure 3B:
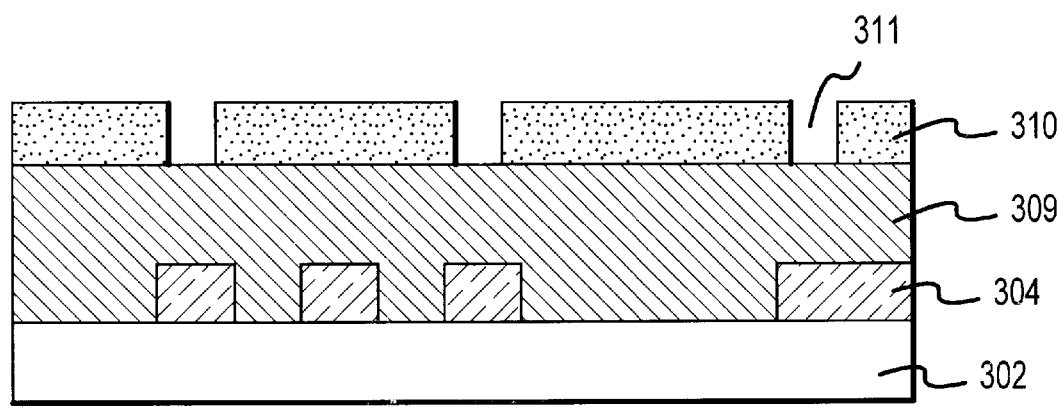
Figure 3C:
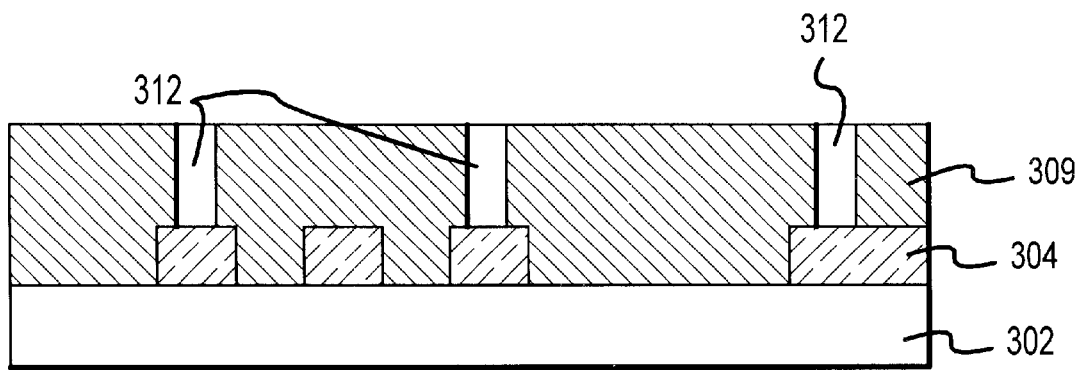
Figure 3D:
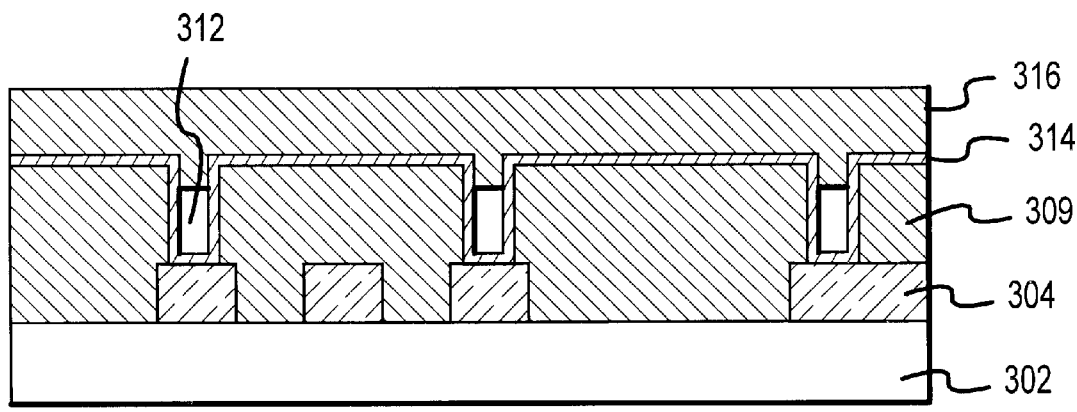

In Step 502, vias 312 are formed in via dielectric 309 (FIGS. 3B–3C). This may be accomplished using a variety of known lithographic techniques, for example, conventional optical lithography (including, for example, I-line and deep-UV), X-ray, E-beam lithography, and plasma etch techniques. In a preferred embodiment, a layer of photoresist 310 is deposited and patterned using a suitable lithographic method. Next, dielectric 309 is suitably etched (e.g., using a dry plasma etch) to form the via hole pattern, and the photoresist layer 310 is removed using, for example, an oxygen-based or hydrogen-based plasma.

Next, in Step 504, a conformal barrier dielectric 314 is deposited within vias 312 and along the topside of via dielectric 309. As mentioned briefly above, this layer will ultimately act as an additional barrier along the inner walls of the vias (i.e., barrier dielectric 314 in FIG. 4). In an exemplary embodiment, barrier dielectric 314 comprises a silicon nitride layer having a thickness of about 100–1000 Å. This layer is suitably formed using a conventional CVD process. Alternatively, barrier dielectric layer 314 may be formed by exposure of the structure to an environment wherein all or part of the via dielectric 309 exposed is substantially transformed to a barrier dielectric. For example, in the case where dielectric layer 309 comprises silicon dioxide, a conventional nitrogen plasma process may be used to transform the exposed via dielectric 309 surface into a thin layer of silicon nitride.

In Step 506, a dielectric layer 316 is then deposited over barrier dielectric 314. In a preferred embodiment, layer 316 comprises a CVD layer of silicon dioxide approximately 0.2–1.0 microns thick. As shown schematically in FIG. 3D, dielectric 316 will typically fill a portion of vias 312 (and might also be deposited along the sidewalls and bottom of via 312).

Figure 3E:
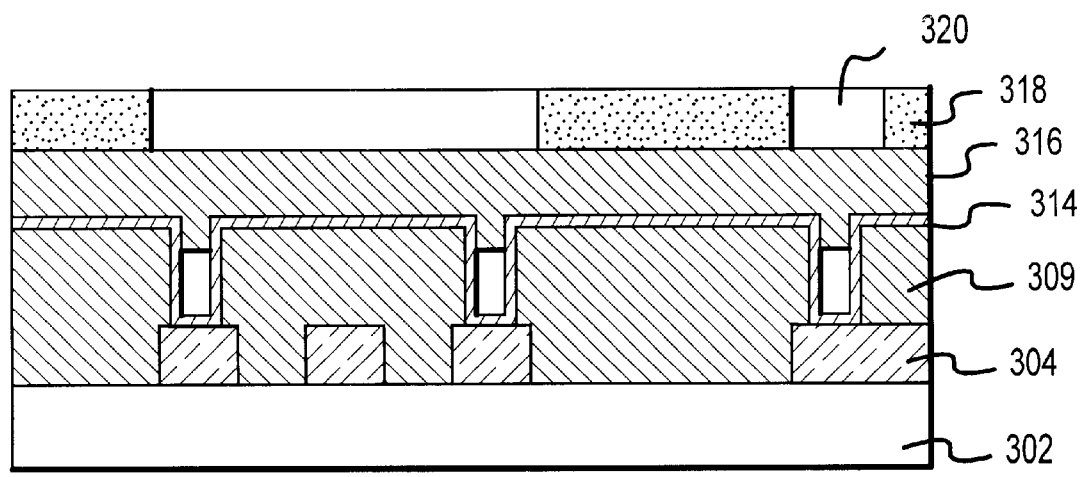
Figure 3F:
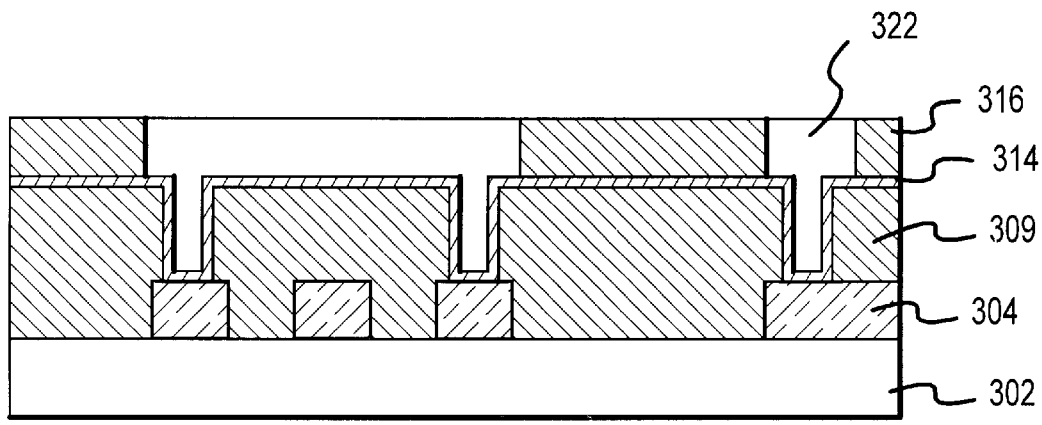

Next, in Step 508, wiring dielectric layer (or "trench dielectric") 316 is patterned in accordance with the desired interconnect wiring pattern (FIGS. 3E–3F). As described above in connection with layer 309, this may be accomplished using a variety of known lithographic techniques, for example, conventional optical lithography (including, for example, I-line and deep-UV), X-ray, E-beam lithography, and plasma etch techniques. In a preferred embodiment, a layer of photoresist 318 is deposited and patterned (pattern 320) using a suitable lithographic method. Next, dielectric 316 (including the dielectric material which partially fills vias 312) is suitably etched (e.g., using a dry plasma etch), and photoresist layer 318 is removed using, for example, an oxygen-based or hydrogen-based plasma. During this step, layer 314 effectively acts as an etch stop. That is, the etch process is chosen such that the materials used for layers 316 and 314 exhibit a differential etch rate. For additional information regarding etching of silicon dioxide, silicon nitride, and the like, see, for example, Givens et al., *Selective dry etching in a high density plasma for 0.5 μm complementary metal-oxide-semiconductor technology*, J. Vac. Sci. Technol. B, p. 427 (January/February 1994), hereby incorporated by reference. After etching, as shown in FIG. 3F, substantially all dielectric material 316 inside the via holes is removed.

Figure 3G:
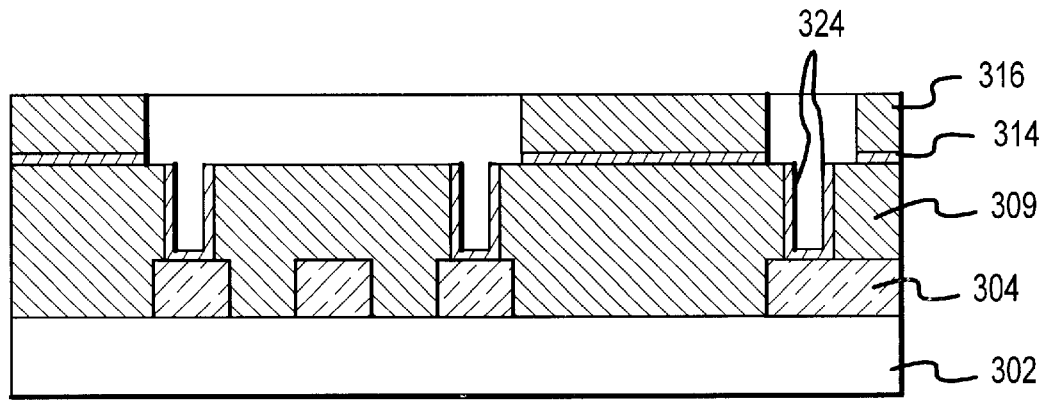

Next, as shown in FIG. 3G, dielectric barrier 314 is etched such that the dielectric barrier is substantially removed at the bottom of the vias and remains along the sidewalls (324) of the vias, yet is substantially removed from the top of dielectric 309 (Step 510). This is preferably accomplished using an anisotropic etching process. In addition, it is preferable that this etch is selective to dielectric 309—i.e., the etch will stop or slow when it exposes dielectric 309. A conventional anisotropic etching process used to form the spacer during the fabrication of CMOS transistors may be used. This provides the desired anisotropic etch of silicon nitride and etch selectivity to silicon dioxide. In one embodiment, approximately 30% to 50% of the silicon nitride remains along sidewalls 324 of the vias.

Figure 3H:
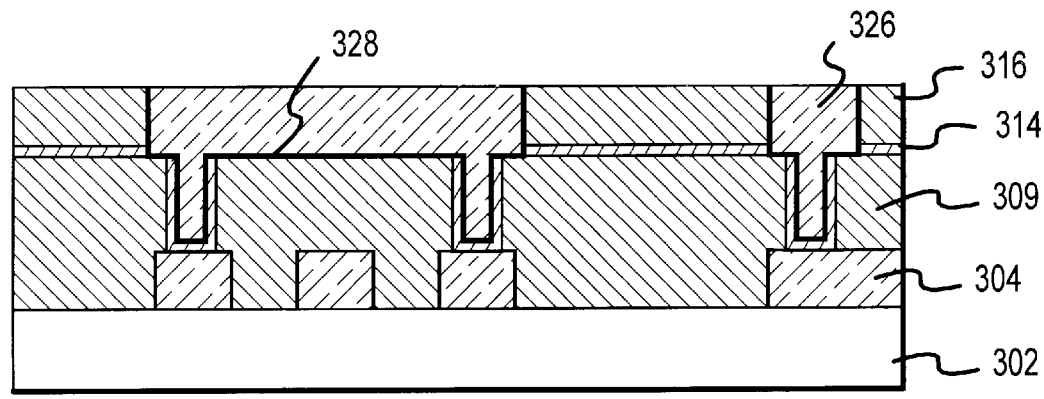
Figure 4:
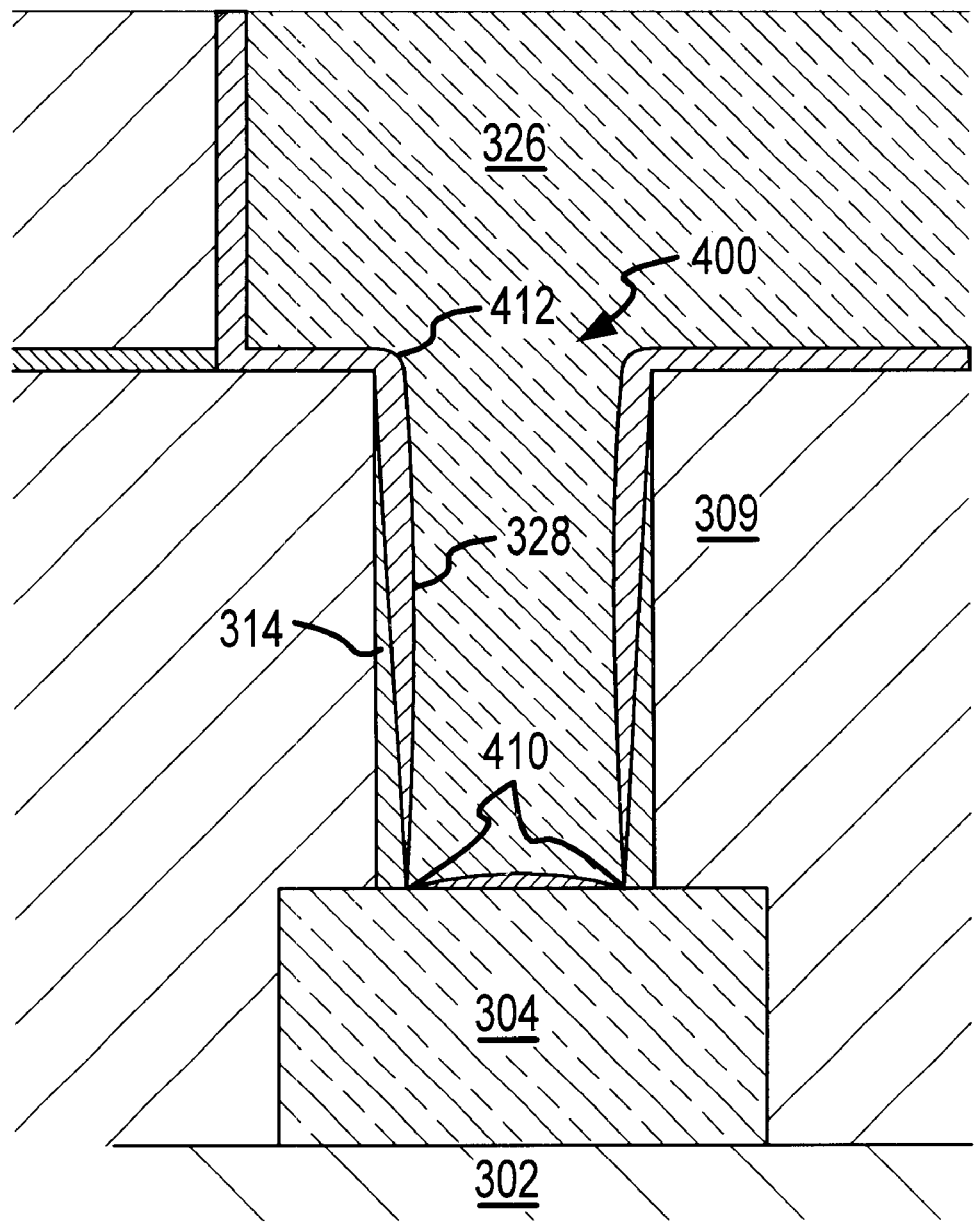
FIG. 4 shows a cross-sectional illustration of an improved barrier along via sidewalls in accordance with the present invention.

In Step 512 a barrier metal 328 is suitably deposited within vias 312 and wiring pattern 322, followed by deposition of bulk metal 326 (FIG. 3H). Barrier layer 328 may consist of a variety of materials, for example, titanium, titanium nitride, tantalum, tantalum nitride, tungsten nitride, TiSiN, TaSiN, CoWP, tungsten, and/or molybdenum. In an exemplary embodiment, the adhesion/barrier layer suitably comprises a Ta/TaN film approximately 50 Å–300 Å deposited using ionized metal plasma (IMP) or hollow cathode magnetron (HCM) sputtering. Referring momentarily to FIG. 4, it will be noted that the combination of metal barrier 328 and dielectric barrier 314 provides a particularly advantageous barrier to prevent copper migration. Just as barrier dielectric 314 tends to taper near the top of the via (due to the anisotropic etching step), barrier metal 328 tends to taper near the bottom of the via (410). Thus, the resulting structure is significantly more robust than prior art structures.

Depending on the particular process, a suitable adhesion/wetting/barrier metal layer may be deposited within trenches 322 and vias 312 (i.e., in addition to or as part of layer 328). As is known in the art, adhesion layers generally assist in strengthening the bond between metal and dielectric layers, and barrier layers provide a barrier to prevent the migration or alloying of one material into another (for example, copper diffusion into silicon). Wetting layers promote metal fill in high aspect-ratio features. In this regard, it should be appreciated that a single material may exhibit one or more of these properties in a particular context. Thus, the terms "adhesion layer", "wetting layer", and "barrier layer" as used herein are not meant to be limiting.

Referring to FIG. 3H, metal 326 suitably consists of a layer or layers of various conductive materials, including, for example, titanium, titanium nitride, tantalum, tantalum nitride, tungsten nitride, aluminum, aluminum-copper alloys, gold, copper, silver, tungsten, or any other suitable conductive material. In an exemplary embodiment, metal 326 comprises copper deposited using electrochemical deposition (or "electroplating"). Alternatively, other deposition techniques such as CVD may be used. Many commercial tools are suitable for the copper-electroplating step, including, for example, the EQUINOX tool manufactured by Semitool and the SABRE tool manufactured by Novellus. Such a system suitably employs a $CuSO_4$-based bath at room temperature using a DC or pulse current waveform control.

In an exemplary embodiment employing electroplating of copper, a copper seed layer is deposited prior to forming bulk copper layer 326. The seed layer helps in delivering electron current uniformly on the wafer for initiation of uniform electroplating. The copper seed layer is suitably formed using ion-metal plasma (IMP) or hollow-cathode-magnetron (HCM) sputtering deposition for better bottom and sidewall coverage. Alternatively, the copper seed layer can be deposited by other PVD techniques or CVD techniques. In an exemplary embodiment, the copper seed layer is approximately 500 Å–2000 Å thick.

In Step 516 the excess metal 330 (not shown) and corresponding adhesion/wetting/barrier layers on the field are removed, forming the desired interconnect wiring (FIG. 3H). In an exemplary embodiment, this step is performed using a conventional CMP process. In the copper metallization context, a suitable CMP slurry consists, for example, of any one of the following combinations: hydrogen peroxide and alumina; ammonium hydroxide and alumina; or nitric acid and alumina. This process can be performed using a conventional polyurethane pad, for example, the IC1000 and IC1400 pads manufactured by Rodel.

In summary, methods have been disclosed for increasing the effective barrier thickness along the via sidewalls in order to eliminate the structure's susceptibility to metal migration. One advantage provided by this new approach is that the dielectric barrier layer is formed along the via sidewalls but not along the wiring trench sidewalls. This is achieved by etching via holes into via dielectric first and then depositing barrier dielectric before the trench dielectric is deposited. The absence of barrier dielectric along the wiring trench sidewalls leads to low interconnect wiring resistance (as more physical trench space is filled with conductive metal) and low interconnect wiring capacitance (because the typical barrier dielectric has a relatively high dielectric constant).

This approach provides yet another advantage, i.e., improved capability to etch dual damascene structures with very high aspect ratios as compared to well known "trench-first", "via-first", and "middle-first" dual damascene approaches. Although the via holes are partially filled with dielectric material after the trench dielectric is deposited, removal of the dielectric material in the via holes during the trench etch step is much easier than with the trench-first and middle-first approaches because there is substantially less dielectric material deposited in the via holes in the present approach. Thus, the present invention can be practiced even in cases where barrier enhancement along the via sidewall is not required, for example, in aluminum dual damascene processes or where a more conformal metal barrier layer can be deposited along the via sidewalls. In such a case, etching of the barrier dielectric layer (Step 510, FIGS. 3F–3G) may be performed either isotropically or anisotropically.

FIG. 6, then, illustrates an alternative method of forming vias in dual damascene structures in accordance the present invention. FIGS. 6A–6F depict a modification of the process shown in FIG. 5, minus steps 504 and 510. The resulting process involves formation of via dielectric 309 and an etch stop layer 315 (i.e., silicon nitride) over conductor 304 (Step 500); formation of vias 312 into etch stop 315 and via dielectric 309 (Step 502, FIG. 6A); deposition of trench dielectric layer 316 (Step 506, FIG. 6B); patterning of dielectric layer 316 to form trenches 322 (Step 508, FIGS. 6C–6D) where etch-stop 315 acts to protect dielectric layer 309 when the dielectric material in the via holes is etched away; etching away etch-stop dielectric 315 at the bottom of the trenches (selective to layer 309) to reduce interlayer capacitance (FIG. 6E); and deposition of barrier metal 328 and bulk metal 326 followed by CMP (Steps 512–516, FIG. 6F).

Figure 7A:
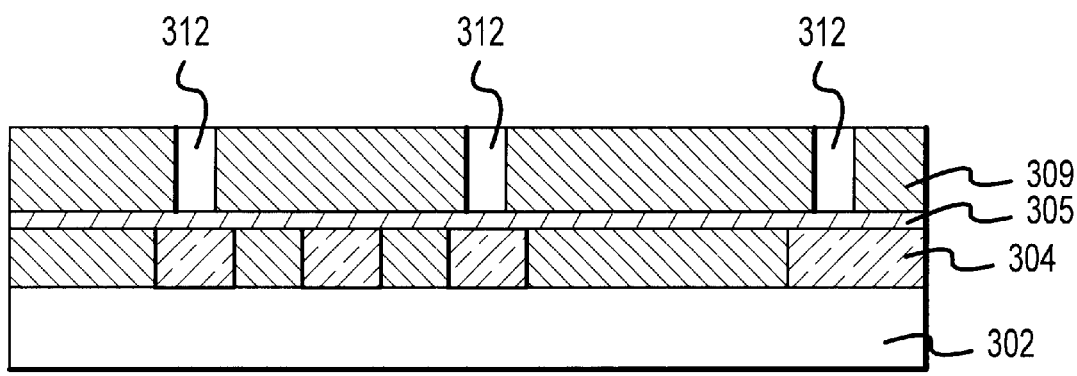
FIGS. 7A–7F shows cross-sectional illustrations of an alternative method of forming dual-damascene interconnects by first forming vias in via dielectric in accordance with the present invention, wherein the lower conductor metal is covered by a barrier dielectric.
Figure 7B:
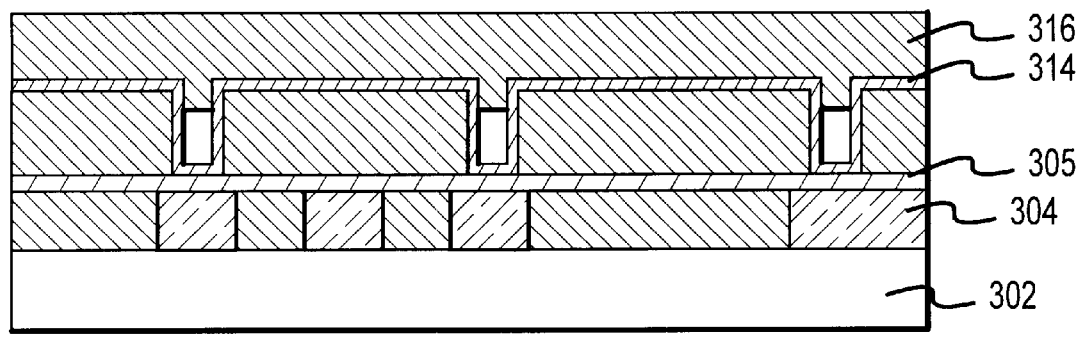
Figure 7C:
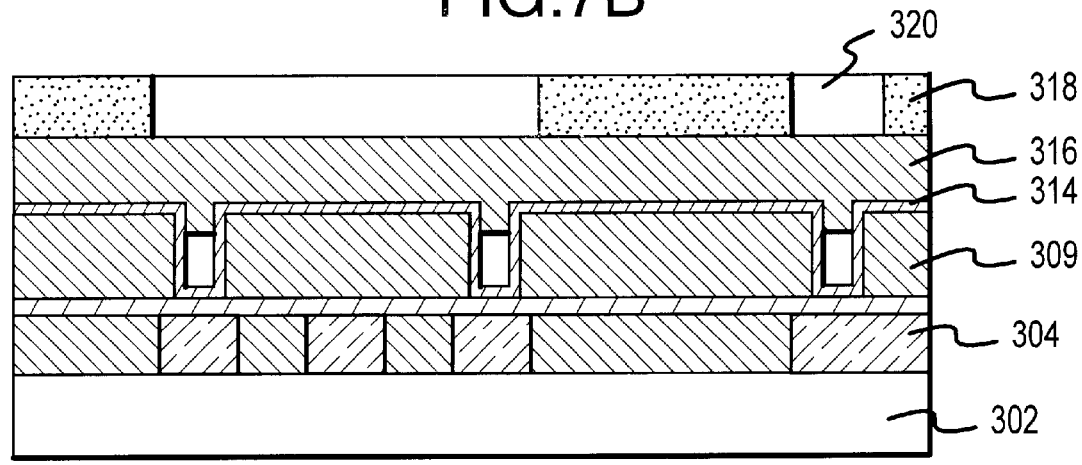

FIGS. 7A–7F show an alternate embodiment of the present invention which further includes use of cap barrier layer 305 (e.g., silicon nitride) over copper conductor 304 (or other suitable metals). This structure may be formed in accordance with the method described above in conjunction with FIG. 3. As shown in FIG. 7A, layer 305 remains after via etch to prevent Cu oxidation in subsequent processing steps. The portion at the bottom of the vias is removed later with the dielectric barrier at the via bottom by the end anisotropic and selective etch (see FIGS. 7D–7E), such that the resulting dielectric barrier remains on the via sidewalls, and the vias are opened.

Figure 2A:
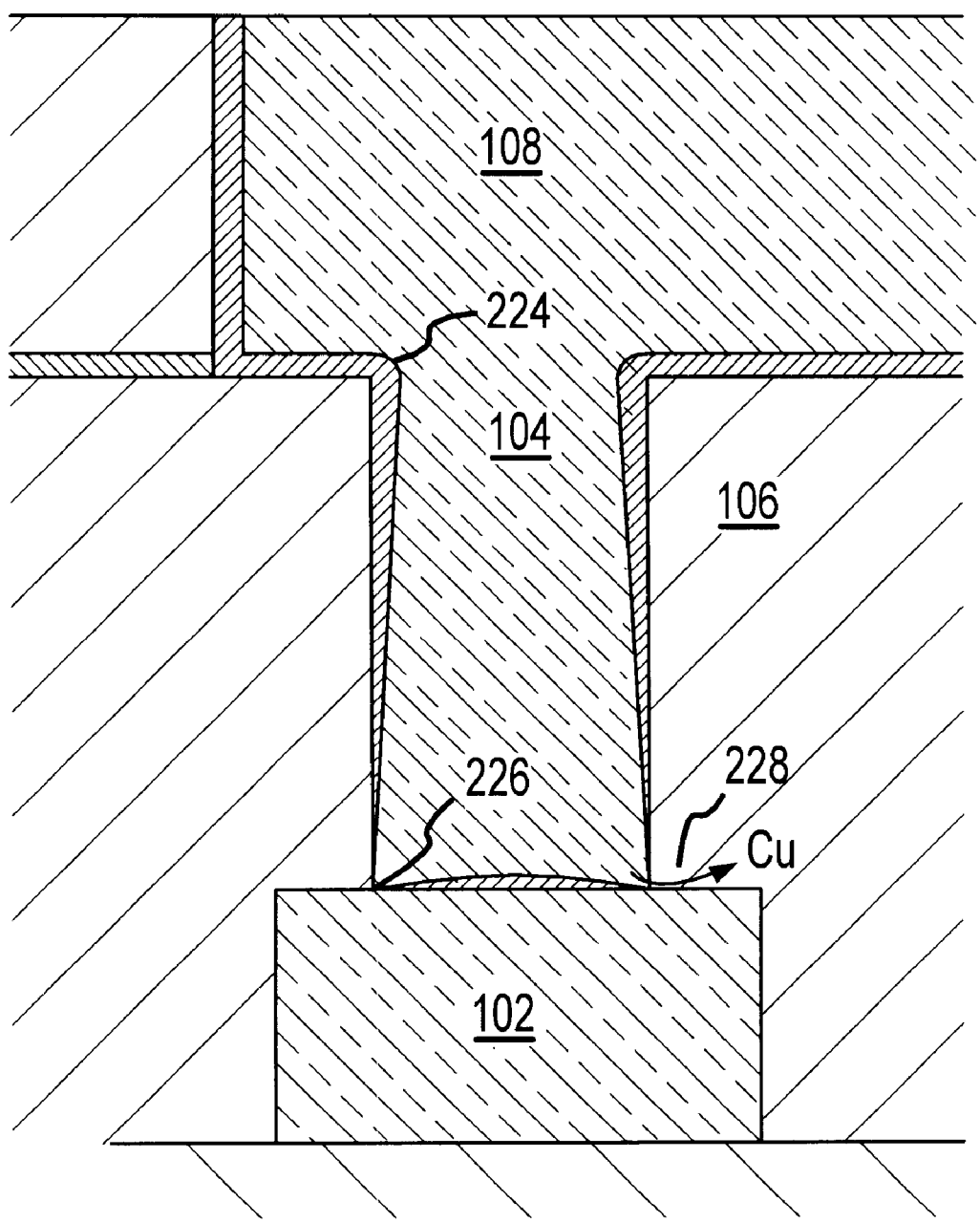
FIGS. 2A–2B show a cross-sectional illustration of a prior art via, depicting its susceptibility to copper migration.
Figure 2B:
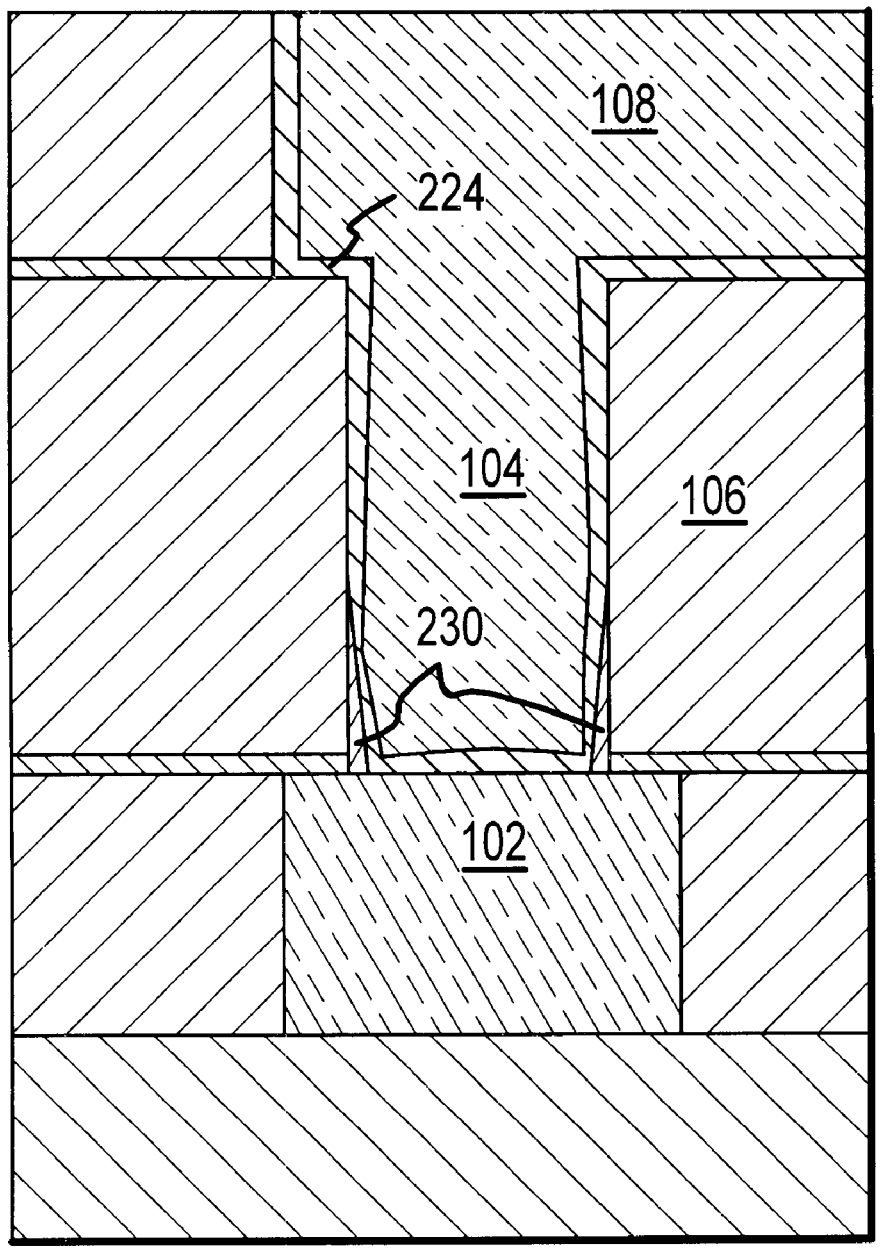
Figure 7D:
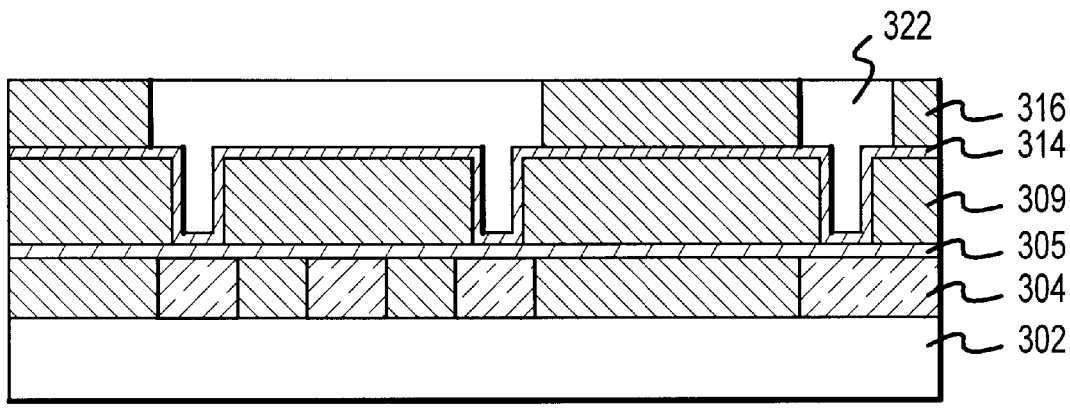
Figure 7E:
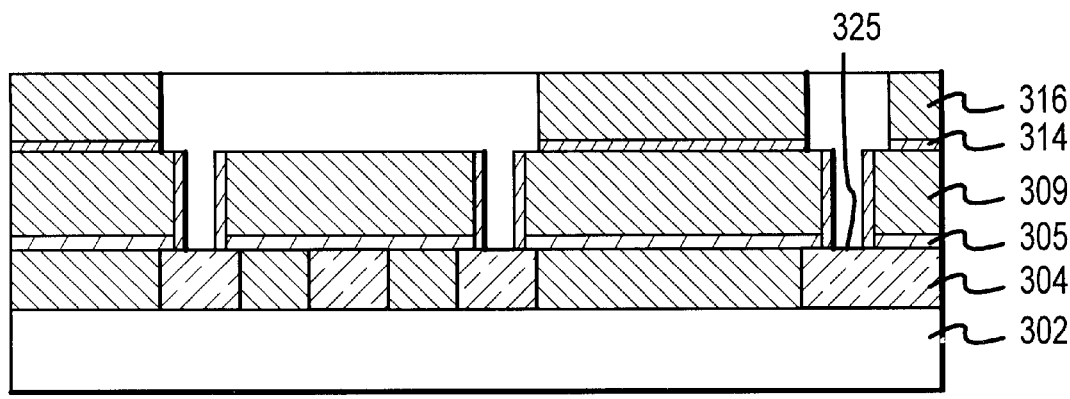
Figure 7F:
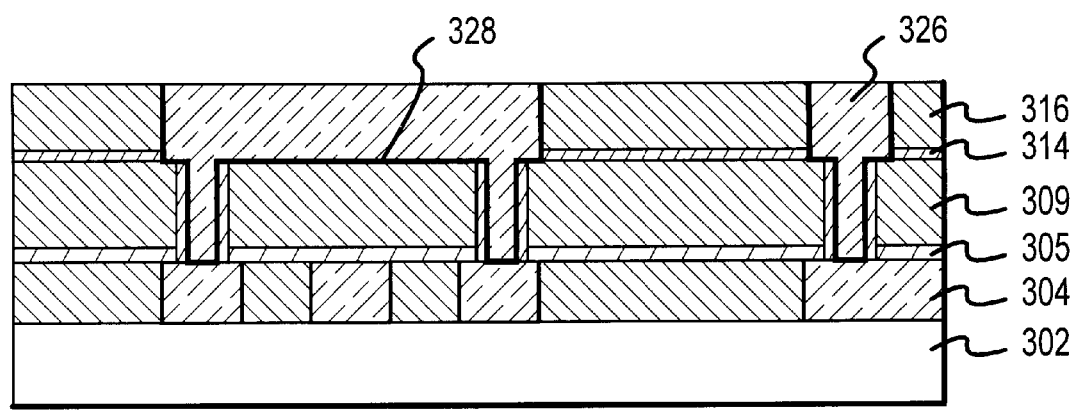
Figure 8:
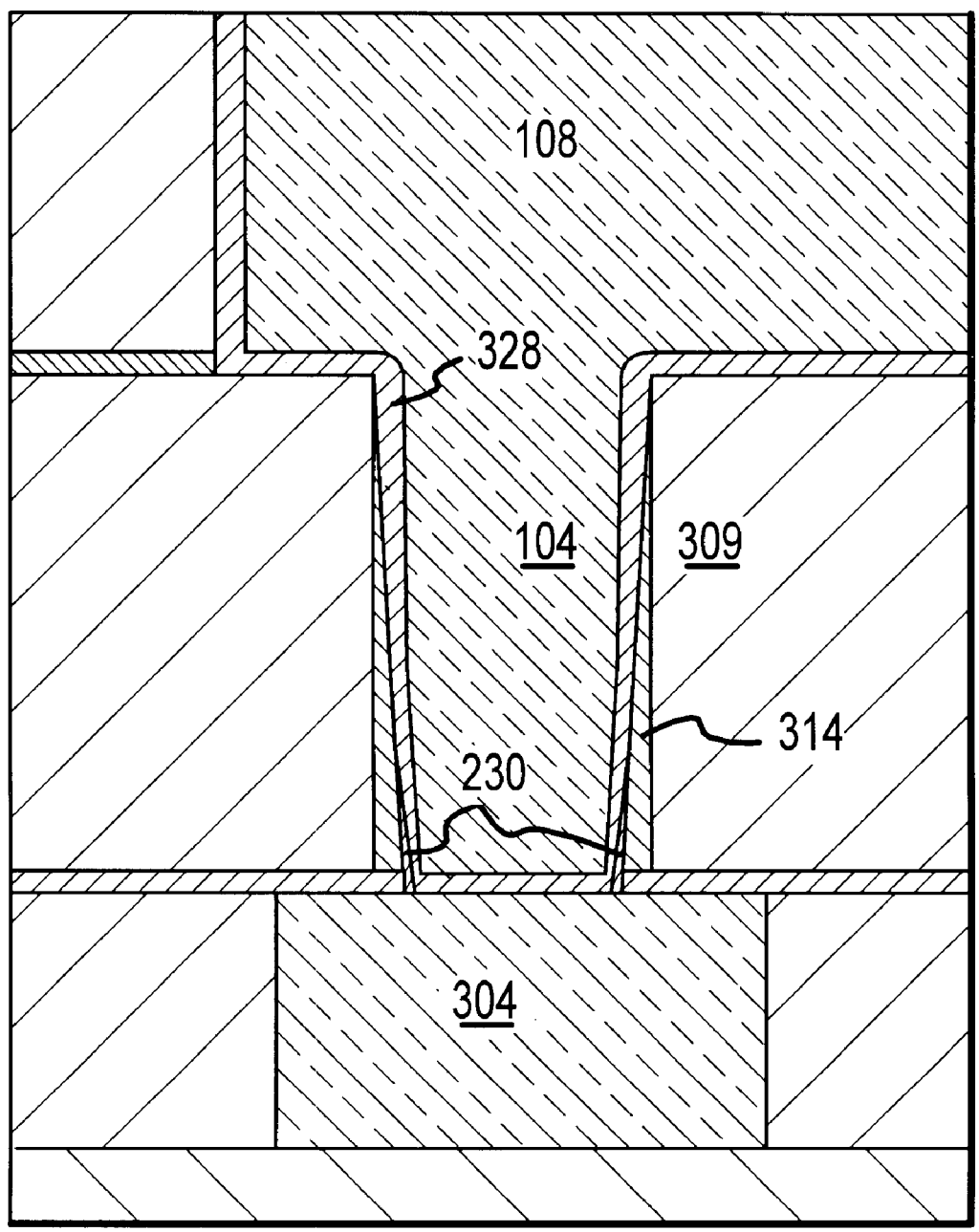
FIG. 8 shows a cross-sectional illustration of an improved barrier along via sidewalls in accordance with the present invention.

It will be appreciated that the current approach with barrier enhancement also prevents migration of extraneous sputtered copper on the via sidewall. That is, as described above in conjunction with FIG. 2B, copper from, for example, a copper conductor 102, tends to be sputtered along the sidewalls during the silicon nitride etch used to open the via connection to the conductor (FIGS. 7D–7E), and during sputter-clean of the conductor just prior to deposition of the metal barrier. As shown in FIGS. 7D–7E, the present invention provides a dielectric barrier along the sidewall before the bottom of the vias are opened to expose the conductor. Referring to FIG. 8, methods in accordance with the present invention result in a dielectric barrier 314 between copper 230 and dielectric 309. Thus, copper 230 is effectively trapped between metal barrier 328 and dielectric barrier 314 and cannot therefore migrate into dielectric 309.

It will be appreciated that multiple interconnect levels may be fabricated using methods in accordance with the present invention. More particularly, it is possible to repeat the methods presented above in order to build one or more subsequent dual damascene interconnect structures upon the existing structure.

Although the invention has been described herein in conjunction with the appended drawings, those skilled in the art will appreciate that the scope of the invention is not so limited. Various modifications in the selection, design, and arrangement of the various components and steps discussed herein may be made without departing from the scope of the appended claims.

What is claimed is:

1. A dual damascene interconnect structure comprising:
   a via dielectric layer having a via formed therein, said via having a top and a bottom, wherein the sidewalls of said via are substantially covered by a dielectric barrier layer, and wherein at least a portion of said dielectric barrier layer is covered by a metal barrier layer;
   a trench dielectric layer having a trench formed therein, wherein said trench communicates with said via, and the sidewalls of said trench are substantially covered by said metal barrier layers; and
   bulk metal formed within said via and said trench, wherein said dielectric barrier layer tapers to a reduced thickness at said top of said via, and said metal barrier layer tapers to a reduced thickness at said bottom of said via.

2. The structure of claim 1, wherein said bulk metal comprises copper.

3. The structure of claim 1, wherein said dielectric barrier layer comprises silicon nitride.

4. The structure of claim 1, wherein said metal barrier layer comprises a metal selected from the group consisting of tantalum, tantalum-nitride, titanium, titanium-nitride, tungsten, and tungsten nitride.

5. The structure of claim 1, wherein said dielectric barrier layer has a first etch rate and said trench dielectric layer has a second etch rate such that when said trench dielectric layer is etched, said dielectric barrier layer is partially etched such that said dielectric barrier layer tapers to a reduced thickness at said top of said via.

6. The structure of claim 1, further comprising a cap barrier layer disposed over at least a conductor and disposed under said via dielectric layer such that said cap barrier layer prevents oxidation of said conductor.

7. The structure of claim 6, wherein said dielectric barrier layer has a first etch rate and said cap dielectric layer has a second etch rate such that said cap barrier layer remains when said dielectric barrier layer is etched.

8. A damascene structure, comprising:
- a first dielectric material having at least one via, said via having a top and a bottom, and said via defined by at least one sidewall in said first dielectric material;
- a dielectric barrier layer configured to resist metal migration, said dielectric barrier layer disposed over the surface of said first dielectric material, and said dielectric barrier layer further disposed on said sidewall; and
- a metal barrier layer configured to resist metal migration, a portion of said metal barrier layer disposed over said dielectric barrier layer on said sidewall such that said sidewall is separated from said via by said dielectric barrier layer and said metal barrier layer,
- wherein said dielectric barrier layer tapers to a reduced thickness at said top of said via, and said metal barrier layer tapers to a reduced thickness at said bottom of said via.

9. The structure of claim 8, wherein said dielectric barrier layer has a first etch rate and a second dielectric material has a second etch rate, said second dielectric material disposed above said dielectric barrier layer, such that when said second dielectric material is etched, said dielectric barrier layer is partially etched such that said dielectric barrier layer tapers to a reduced thickness at said top of said via.

10. The structure of claim 8, further comprising a cap barrier layer disposed between at least one conductor and said first dielectric material such that said cap barrier layer prevents oxidation of said conductor.

11. The structure of claim 10, said cap barrier layer having a first etch rate and said first dielectric material having a second etch rate such that when said first dielectric material is etched to form said via, said cap barrier layer remains such that said cap barrier layer prevents oxidation of said conductor.

12. A damascene structure, comprising:
- a via dielectric layer having a, via formed therein, said via defined by at least one sidewall on said via dielectric layer, said via having a top and a bottom;
- a trench dielectric layer having a trench formed therein, said trench defined by at least one trench sidewall on said trench dielectric layer, wherein said trench is in communication with said via;
- a dielectric barrier layer configured to resist metal migration, said dielectric barrier layer covering at least said sidewall such that said dielectric barrier layer tapers to a reduced thickness at said top of said via;
- a metal barrier layer configured to resist metal migration, said metal barrier layer covering at least said trench sidewall and said dielectric barrier layer such that said metal barrier layer tapers to a reduced thickness at said bottom of said via; and
- a bulk metal formed within said via and said trench, said bulk metal comprising a metal that said dielectric barrier layer and said metal barrier layer are configured to resist migration of.

13. The structure of claim 12, wherein said dielectric barrier layer has a first etch rate and said trench dielectric layer has a second etch rate, said trench dielectric layer disposed over said dielectric barrier layer, such that when said trench dielectric layer is etched to form said trench, said dielectric barrier layer is partially etched such that said dielectric barrier layer tapers to said reduced thickness at said top of said via.

14. The structure of claim 12, further comprising a cap barrier layer disposed between at least one conductor and said via dielectric layer such that said cap barrier layer prevents oxidation of said conductor.

15. The structure of claim 14, said cap barrier layer having a first etch rate and said via dielectric layer having a second etch rate such that when said via dielectric layer is etched to form said via, said cap barrier layer remains such that said cap barrier layer prevents oxidation of said conductor.

* * * * *